(12) United States Patent
Hong et al.

(10) Patent No.: US 8,316,527 B2
(45) Date of Patent: Nov. 27, 2012

(54) METHOD FOR PROVIDING AT LEAST ONE MAGNETORESISTIVE DEVICE

(75) Inventors: Liubo Hong, San Jose, CA (US); Honglin Zhu, Fremont, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 1043 days.

(21) Appl. No.: 12/060,724

(22) Filed: Apr. 1, 2008

(65) Prior Publication Data

US 2009/0244789 A1    Oct. 1, 2009

(51) Int. Cl.
G11B 5/127 (2006.01)
H04R 31/00 (2006.01)

(52) U.S. Cl. ............... 29/603.16; 29/603.13; 29/603.14; 29/603.15; 29/603.18; 216/62; 216/65; 216/66; 360/324.1; 360/324.11; 360/324.12; 360/324.2; 451/5; 451/41

(58) Field of Classification Search ............... 29/603.07, 29/603.13–603.16, 603.18; 216/62, 65, 66; 360/324.1, 324.11, 324.12, 324.2; 451/5, 451/41; 427/127–131
See application file for complete search history.

(56) References Cited

U.S. PATENT DOCUMENTS

| | | | |
|---|---|---|---|
| 4,939,837 A | 7/1990 | Krounbi | |
| 5,654,128 A | 8/1997 | Hsu | |
| 5,669,133 A | 9/1997 | George | |
| 5,718,976 A | 2/1998 | Dorfman et al. | |
| 6,156,485 A | 12/2000 | Tang et al. | |
| 6,211,061 B1 | 4/2001 | Chen et al. | |
| 6,212,047 B1 | 4/2001 | Payne et al. | |
| 6,309,955 B1 | 10/2001 | Subramanian et al. | |
| 6,320,725 B1 | 11/2001 | Payne et al. | |
| 6,421,212 B1 | 7/2002 | Gibbons et al. | |
| 6,468,642 B1 | 10/2002 | Bray et al. | |
| 6,493,926 B2 | 12/2002 | Han et al. | |
| 6,495,311 B1 | 12/2002 | Khan et al. | |
| 6,496,334 B1 | 12/2002 | Pang et al. | |
| 6,582,889 B1 | 6/2003 | Kamijima | |
| 6,632,707 B1 | 10/2003 | Wang et al. | |
| 6,713,237 B2 | 3/2004 | Seigler et al. | |
| 6,728,055 B1 | 4/2004 | Gill et al. | |
| 6,798,620 B2 | 9/2004 | Hiramoto et al. | |
| 6,801,408 B1 | 10/2004 | Chen et al. | |
| 6,989,971 B2 | 1/2006 | Lin et al. | |
| 7,037,847 B2 | 5/2006 | Le et al. | |
| 7,061,728 B2 | 6/2006 | Pinarbasi | |
| 7,070,697 B2 | 7/2006 | Freitag et al. | |
| 7,095,585 B2 | 8/2006 | Payne et al. | |
| 7,146,711 B2 | 12/2006 | Han et al. | |
| 7,163,751 B2 | 1/2007 | Wayton et al. | |
| 7,175,944 B2 | 2/2007 | Yin et al. | |

(Continued)

OTHER PUBLICATIONS

Benjamin Chen, et al., U.S. Appl. No. 11/352,652, filed Feb. 13, 2006.

(Continued)

*Primary Examiner* — Paul D Kim

(57) ABSTRACT

The method provides a magnetoresistive device. The magnetoresistive device is formed from a plurality of magnetoresistive layers. The method includes providing a mask. The mask covers a first portion of the magnetoresistive element layers in at least one device area. The magnetoresistive element(s) are defined using the mask. The method includes depositing hard bias layer(s). The method also includes providing a hard bias capping structure on the hard bias layer(s). The hard bias capping structure includes a first protective layer and a planarization stop layer. The first protective layer resides between the planarization stop layer and the hard bias layer (s). The method also includes performing a planarization. The planarization stop layer is configured for the planarization.

15 Claims, 7 Drawing Sheets

U.S. PATENT DOCUMENTS

| | | | |
|---|---|---|---|
| 7,194,797 B2 | 3/2007 | Pinarbasi | |
| 7,228,617 B2 | 6/2007 | Lin et al. | |
| 7,230,801 B2 | 6/2007 | Lin et al. | |
| 7,237,321 B2 | 7/2007 | Cyrille et al. | |
| 7,262,138 B1 | 8/2007 | Singh et al. | |
| 7,270,917 B2 | 9/2007 | Yin et al. | |
| 7,272,080 B2 | 9/2007 | Kudo | |
| 7,275,304 B2 | 10/2007 | Sakai et al. | |
| 7,283,337 B2 | 10/2007 | Sakai et al. | |
| 7,369,371 B2 * | 5/2008 | Freitag et al. | 360/324.11 |
| 7,640,650 B2 | 1/2010 | Araki et al. | |
| 2002/0093761 A1 | 7/2002 | Payne et al. | |
| 2003/0092281 A1 | 5/2003 | Ramachandramurthy | |
| 2003/0179497 A1 | 9/2003 | Harris et al. | |
| 2005/0024793 A1 | 2/2005 | Nakabayashi et al. | |
| 2005/0094315 A1 | 5/2005 | Payne et al. | |
| 2005/0219771 A1 | 10/2005 | Sato et al. | |
| 2005/0227482 A1 | 10/2005 | Korzenski | |
| 2006/0025053 A1 | 2/2006 | Cyrille et al. | |
| 2006/0044705 A1 | 3/2006 | Hasegawa et al. | |
| 2006/0196039 A1 | 9/2006 | Sakai et al. | |
| 2006/0198059 A1 | 9/2006 | Sakai et al. | |
| 2006/0293208 A1 | 12/2006 | Egbe et al. | |
| 2007/0048624 A1 | 3/2007 | Chen et al. | |
| 2007/0217088 A1 | 9/2007 | Freitag et al. | |
| 2007/0218679 A1 | 9/2007 | Schneider et al. | |

OTHER PUBLICATIONS

Danning Yang, et al., U.S. Appl. No. 11/635,830, filed Dec. 7, 2006.

* cited by examiner

METHOD FOR PROVIDING AT LEAST ONE MAGNETORESISTIVE DEVICE

BACKGROUND

FIG. 1 depicts a conventional method 10 for providing a magnetoresistive element using a conventional undercut bilayer mask. The layers of the magnetoresistive element are provided, via step 12. Typically, step 12 includes sputter depositing the layers for a spin valve or other analogous giant magnetoresistive (GMR) element. A capping layer for the magnetic element may also be provided, via step 14. For example, Ta or DLC might be used. A bilayer mask is provided on the device, via step 16. The bilayer mask has an undercut at the edges of the mask. The magnetic element is defined, via step 18. Consequently, portions of the layers for the magnetoresistive element exposed by the bilayer mask are removed. Hard bias layers may then be deposited, via step 20. A lift-off may be performed, via step 22. The lift-off removes the bilayer mask. A capping layer, such as Ta, and leads may be provided, via step 24.

Although the conventional method 10 functions at lower densities, issues arise for higher densities. The bottom layer of the bilayer mask has a smaller width, or critical dimension, than the upper layer. Consequently, as discussed above, the bilayer mask is undercut. However, at smaller critical dimensions on the order of 0.06-0.08 μm or less, significant issues are encountered. In particular, the bilayer mask tends to collapse. In addition, the track width becomes difficult to control. Consequently, yield is reduced.

Accordingly, what is needed is an improved system and method for providing an magnetoresistive device, particularly which may be suitable for higher memory densities.

SUMMARY

The method and system for providing a magnetoresistive device are disclosed. The magnetoresistive device is formed from a plurality of magnetoresistive layer. The method and system include providing a mask. The mask covers a first portion of the magnetoresistive element layers in at least one device area. The magnetoresistive element(s) are defined using the mask. The method and system include depositing hard bias layer(s). The method and system also include providing a hard bias capping structure on the hard bias layer(s). The hard bias capping structure includes a first protective layer and a planarization stop layer. The first protective layer resides between the planarization stop layer and the hard bias layer(s). The method and system also include performing a planarization. The planarization stop layer is configured for the planarization.

DETAILED DESCRIPTION OF THE PREFERRED EMBODIMENTS

Figure 1:
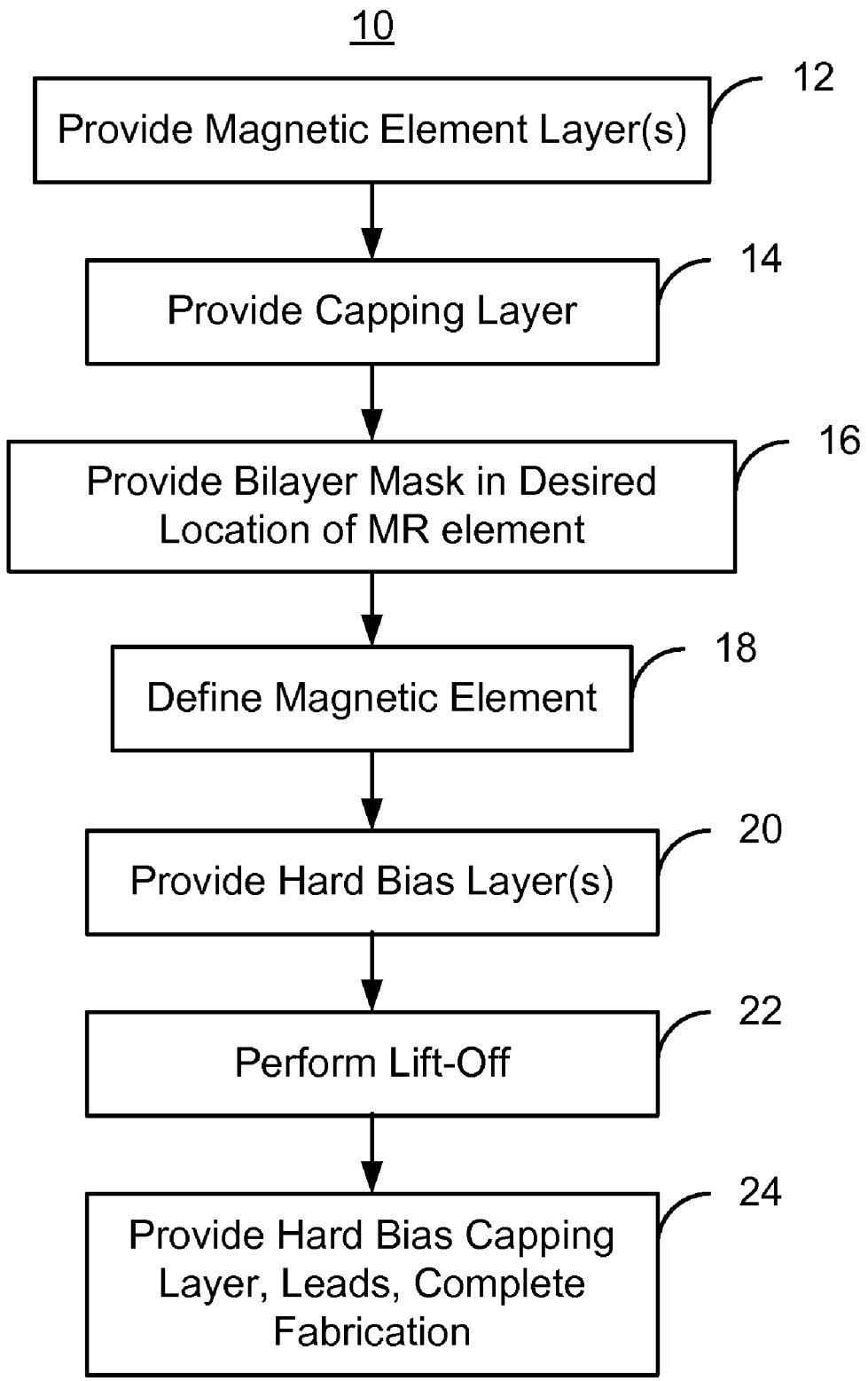
FIG. 1 depicts a conventional method for fabricating a magnetoresistive device.
Figure 2:
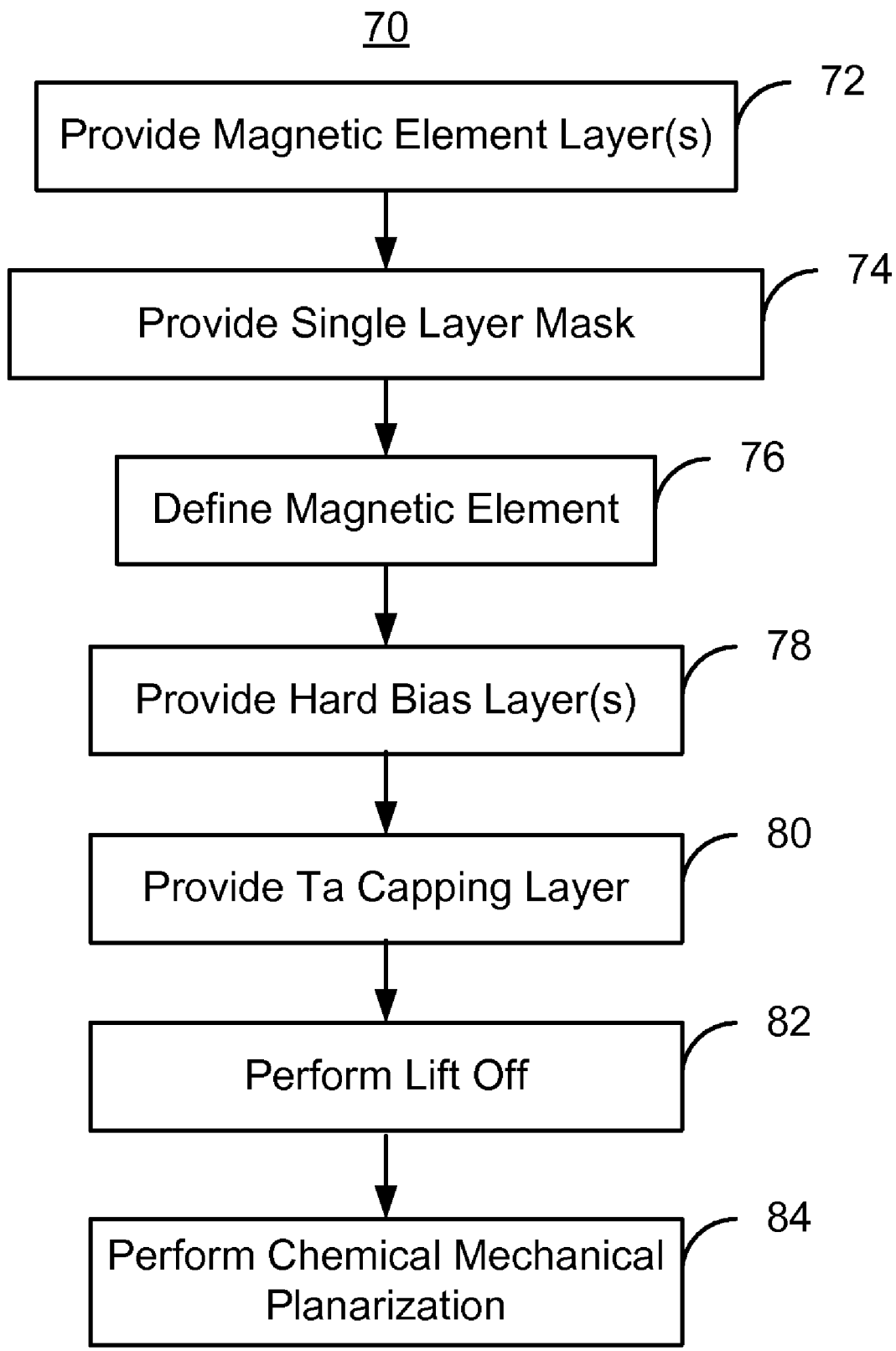
FIG. 2 depicts a method for fabricating a magnetoresistive device

FIG. 2 depicts a more recent method 70 for fabricating a magnetoresistive device. For simplicity, step may be omitted or combined. Similarly, different and/or additional steps may be used. The magnetoresistive device being fabricated may be part of a read head. The read head may be part of a merged head that also includes a write head (not shown) and resides on a slider (not shown).

The layers of the magnetoresistive element are provided, via step 72. Typically, step 72 includes sputter depositing the layers for a spin valve, a tunneling magnetoresistive (TMR) junction, or other analogous giant magnetoresistive (GMR) element. A capping layer may also be provided in step 72. For example, Ta or DLC might be used. A single layer mask is provided on the device, via step 74. As used herein, a single layer photoresist mask has sides that are not undercut. For some single layer masks, an organic underlayer may be used along with a single layer of photoresist.

The magnetic element is defined, via step 76. Step 76 may include performing a critical junction ion mill. Thus, the magnetoresistive element has been formed from the magnetoresistive layers. A hard bias layer and a capping layer are typically deposited, via steps 78 and 80. The hard bias layer and capping layer may be blanket deposited. The hard bias may include materials such as CoPt. The capping layer may include Ta. A lift off is performed, via step 82. The lift-off removes at least a portion of the single layer mask. A planarization, such as a chemical mechanical planarization (CMP) is performed, via step 84. Thus, any remaining portion of the single layer mask may be removed by the CMP. In addition, the top surface of the device being formed is substantially flat. Fabrication of the device may then be completed.

Using the method 70, a magnetoresistive device may be provided. Further, the use of a bi-layer mask having an undercut may be avoided. Consequently, issues due to collapse of the bi-layer mask may be reduced or eliminated. Magnetoresistive elements for use at higher densities may be provided. For example, a magnetoresistive element having a critical dimension of not more than ninety nanometers might be provided. However, there may be large variations in the CMP performed in step 84. In particular, the hard bias layer may be exposed. As a result, the magnetoresistive device may be subject to failure. Consequently, during mass production, a significant percentage of such magnetic devices may be scrapped. As a result, an improved method for fabricating MR devices is still desired.

Figure 3:
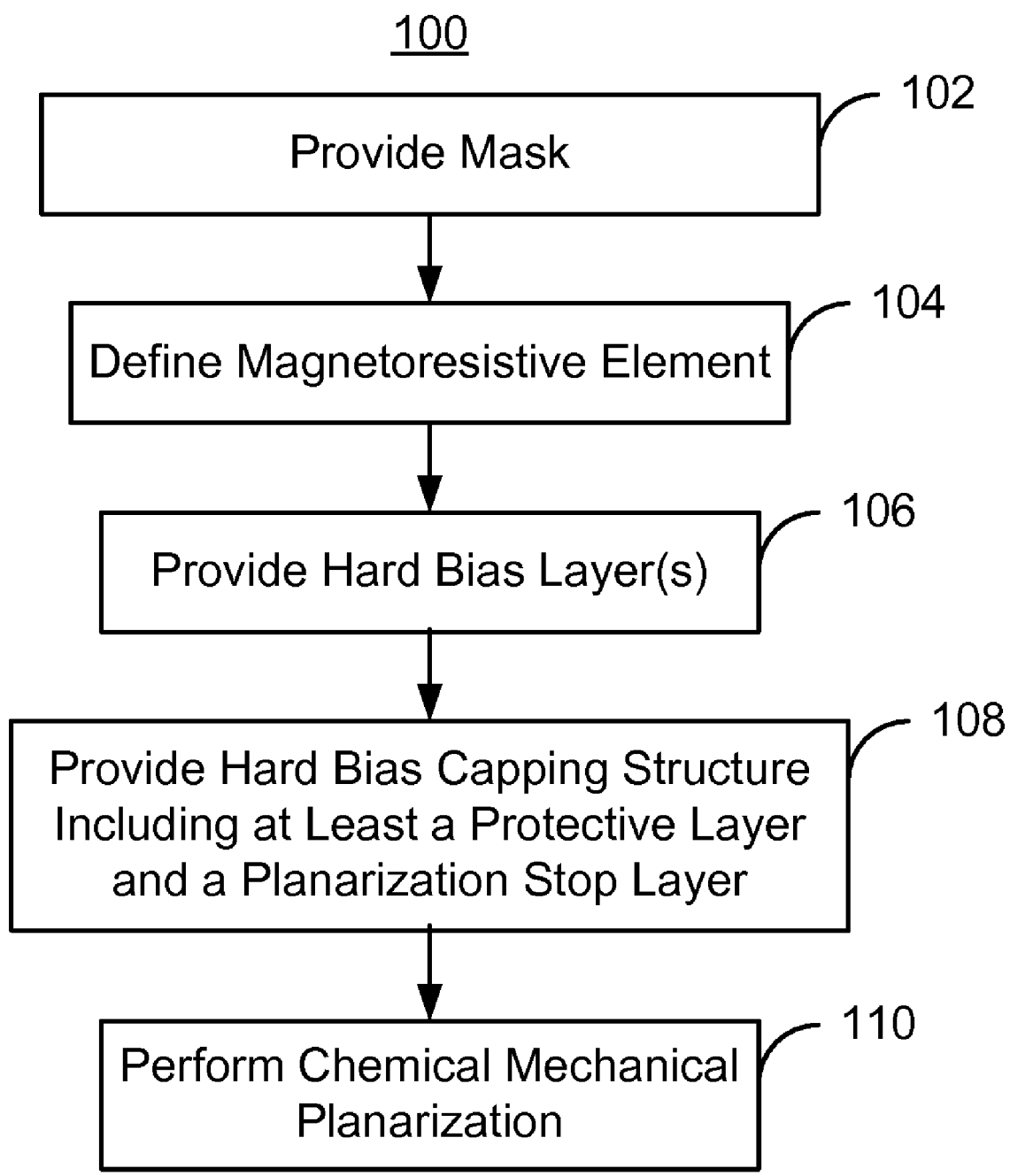
FIG. 3 is a flow chart depicting one exemplary embodiment of a method for fabricating a magnetoresistive device.

FIG. 3 is a flow chart depicting one exemplary embodiment of a method 100 for fabricating an MR device having smaller critical dimensions. Although the method 100 is described in the context of particular steps and particular magnetoresistive elements, other magnetoresistive elements may be provided and different and/or additional steps may be used. The steps described may also include one or more sub-steps. In addition, although the method 100 is described in the context of providing single layers, in one embodiment, such a layer may include multiple layers. The method 100 is also described in the context of providing a single magnetoresistive element. However, the method 100 may be used to fabricate multiple magnetoresistive elements at substantially the same time.

The method 100 commences after the layers for the magnetoresistive element have been provided. In one embodiment, the magnetoresistive element layers cover at least one device area and at least one field area. Thus, in a one embodiment, the magnetoresistive element layers are blanket deposited. The magnetoresistive layers may include, for example, layers for a spin valve or tunneling magnetoresistive element.

A mask that covers the portion of the magnetoresistive element layer(s) from which the magnetic element is to be formed is provided, via step 102. Step 102 may include depositing a layer of photoresist and transferring a pattern to the photoresist layer. The mask covers the magnetoresistive element layers in device area(s) and exposes the magnetoresistive element layers in other area(s). Thus, the mask exposes a portion of the magnetoresistive element layers. In one embodiment, the mask is a single layer mask. Such a mask could include a layer of photoresist as well as an underlayer. However, in one embodiment, there is no undercut for the mask.

The magnetoresistive element is defined using the mask, via step 104. In one embodiment, step 104 includes performing an ion mill. Because of the configuration of the single layer mask, a portion of the magnetoresistive element layers are preferably removed in step 104. The hard bias layer(s) are deposited, via step 106. The hard bias layer may be blanket deposited in step 106. In one embodiment, step 106 is performed after the magnetoresistive element has been defined. In one embodiment, step 106 includes depositing seed layers for the hard magnetic materials used in the hard bias materials. Step 106 includes providing hard magnetic materials, such as CoPt. In addition, an insulating layer between the seed layers and the magnetic element may be provided.

A hard bias capping structure is provided on the hard bias layer(s), via step 108. In one embodiment, the hard bias capping structure includes at least a first protective layer and a planarization stop layer. The first protective layer resides between the planarization stop layer and the hard bias layer(s). The first protective layer includes materials such as at least one of Ru, Ta, Cr, and NiCr. In one embodiment, the first protective layer is used to protect the hard bias layer and to provide some material for consumption during subsequent ion milling. In one embodiment, the first protective layer has a thickness of at least twenty and not more than one hundred and five Angstroms. In another embodiment, the first protective layer thickness is at least forty and not more eighty Angstroms. As its name suggests, the planarization stop layer is used as a stop layer for a planarization, described below. In one embodiment, the planarization stop layer is a CMP stop layer. The planarization stop layer may include materials such as at least one of Ru and Rh. In one embodiment, the planarization stop layer has a thickness of at least ten and not more than one hundred twenty Angstroms. In another embodiment, the thickness of the planarization stop layer is at least thirty and not more than seventy Angstroms.

In one embodiment, step 108 also includes providing a second protective layer on the planarization stop layer. Thus, the planarization stop layer resides between the first protective layer and the second protective layer. The second protective layer includes at least one of Ta, Ru, Cr and NiCr. The second protective layer may be at least partially consumed during ion milling in subsequent processing. In one embodiment, the second protective layer has a thickness of at least forty and not more than one hundred and five Angstroms. In another embodiment, the second protective layer thickness is at least fifty and not more than eighty-five Angstroms.

A planarization is performed, via step 110. The planarization performed in step 110 may be a CMP. In one embodiment, the planarization is performed after the mask has been removed, for example by a lift-off process. Thus, the planarization may be considered part of a planarization enhanced lift-off process. In such a process, an aperture is provided through the hard bias layer(s) to assist in liftoff. This aperture may be formed using ion milling. The second protective layer may be substantially consumed during this ion mill. However, at least part of the planarization stop layer and the first protective layer remain. The planarization stop layer is configured for the planarization of step 110. The planarization may remove any remaining portion of the mask and other residues.

Using the method 100, a magnetic element having a low critical dimension may be provided. For example, the magnetoresistive element may have a critical dimension of ninety nanometers or less, particularly if a single layer mask may be employed. Consequently, the advantages of a single layer mask may be achieved. Because of the configuration of the hard bias capping structure, subsequent processing may not adversely affect the materials in the hard bias layer(s). In particular, ion milling and planarization during lift-off may not expose the hard bias layer(s). Consequently, such layers may remain pristine. As a result, failure of the devices may be reduced or minimized. Fabrication of the magnetoresistive device is thereby enhanced.

Figure 4:
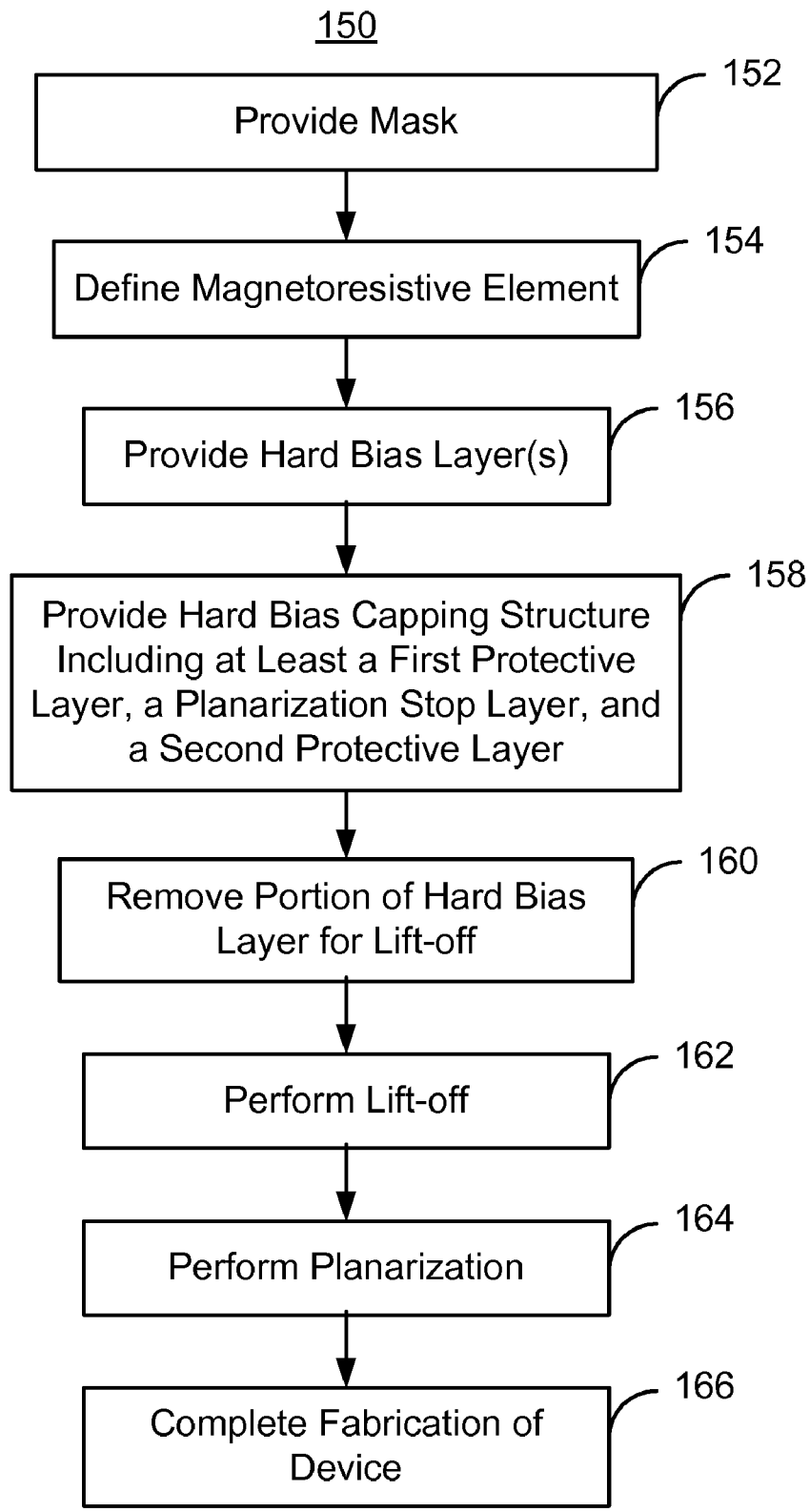
FIG. 4 is a flow chart depicting another exemplary embodiment of a method for fabricating a magnetoresistive device.

FIG. 4 is a flow chart depicting another exemplary embodiment of a method 150 for fabricating an magnetoresistive device. FIGS. 5-9 depict an exemplary embodiment of a magnetoresistive device 200 during fabrication. Referring to FIGS. 4-9, in one embodiment, the magnetoresistive elements being formed have critical dimensions of not more than ninety nanometers. Although the method 150 is described in the context of particular steps and particular magnetoresistive elements, one of ordinary skill in the art will recognize that other magnetoresistive elements may be provided and different and/or additional steps may be used. In addition, one of ordinary skill in the art will recognize that the steps described may include one or more sub-steps. In addition, although the method 150 and magnetoresistive device 200 are described in the context of providing single layers, such layers may include multiple sub-layers.

The method 150 commences after the layers for the magnetoresistive element have been provided. The magnetoresistive element layers may cover at least one device area and at least one field area. Thus, in a one embodiment, the magnetoresistive element layers are blanket deposited. The magnetoresistive layers may include, for example, layers for a spin valve, tunneling magnetoresistive element, and/or other GMR structure.

Figure 5:
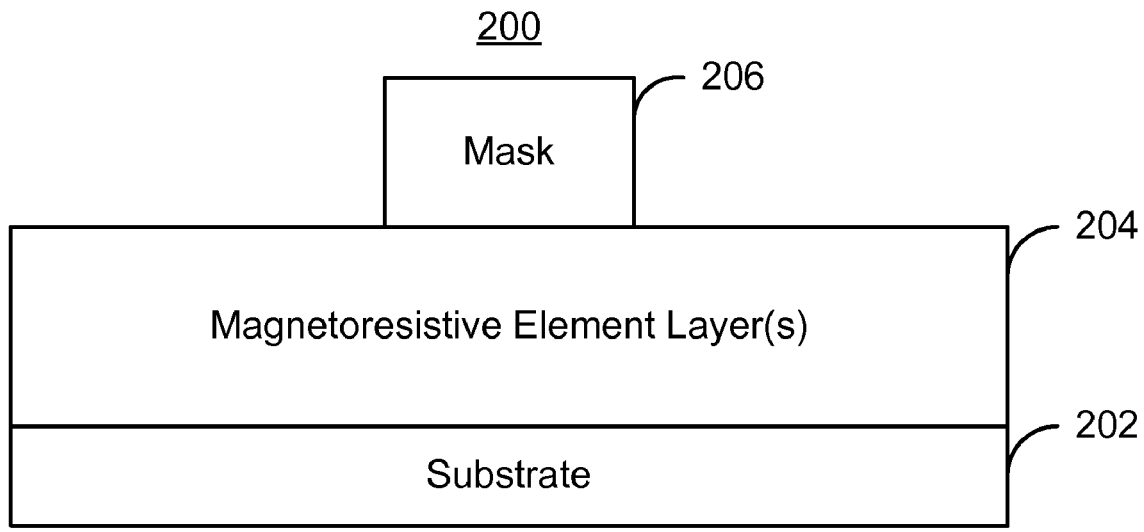
FIGS. 5-9 depict an exemplary embodiment of a magnetoresistive device during fabrication using a single layer mask.

A mask that covers the portion of the magnetoresistive element layer(s) from which the magnetic element is to be formed is provided, via step 152. FIG. 5 depicts the magnetoresistive device 200 after step 152 is performed. The mask 208 covers the magnetoresistive element layers 204 in device area(s) and exposes the magnetoresistive element layers in other area(s). Thus, the mask 206 exposes a portion of the magnetoresistive device layers 204. In the embodiment shown, the mask 206 is a single layer mask. Such a mask 206 could include a layer of photoresist as well as an underlayer (not shown). However, in one embodiment, there is no undercut for the mask 206. Step 152 may include depositing a layer of photoresist and transferring a pattern to the photoresist layer.

Figure 6:
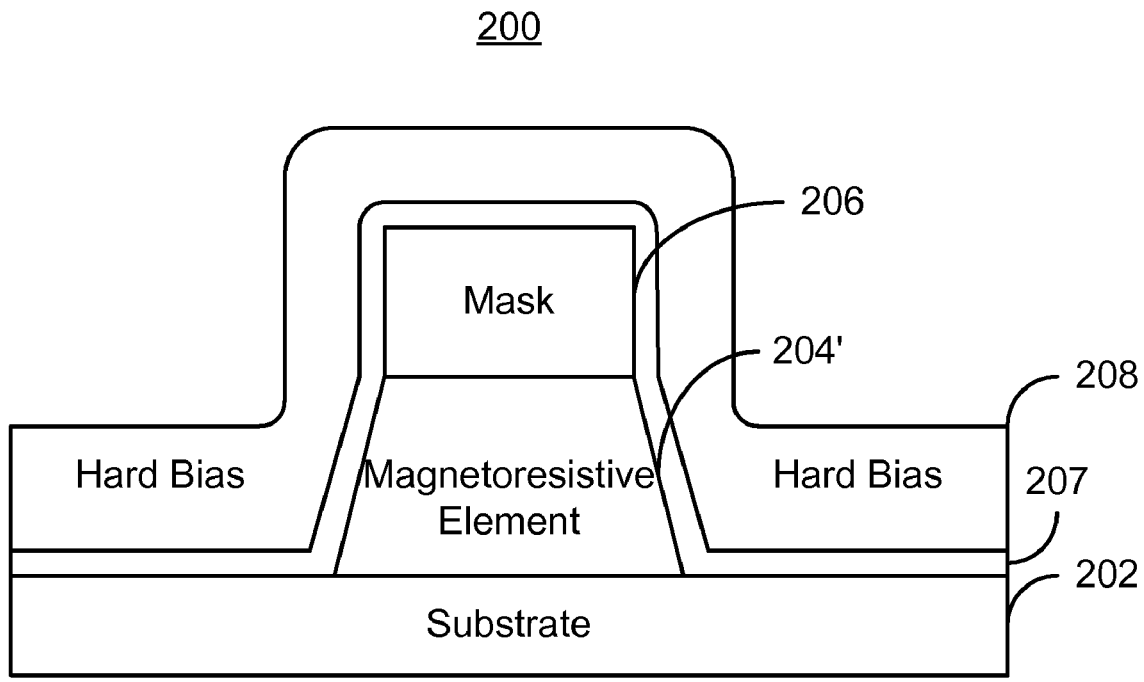

The magnetoresistive element is defined using the mask 206, via step 154. In one embodiment, step 154 includes performing an ion mill. Because of the configuration of the mask 154, the exposed portions of the magnetoresistive element layers are removed in step 154. The hard bias layer(s) are deposited, via step 156. The hard bias layer may be blanket deposited in step 156. In one embodiment, step 156 is performed after the magnetoresistive element has been defined. Step 156 includes providing hard magnetic materials, such as CoPt. Seed layers for the hard magnetic materials are also generally provided in step 156. FIG. 6 depicts the magnetoresistive device 200 after step 156 is performed. Thus, had bias layer 208 has been formed. In addition, in one embodiment, step 156 may include providing an insulating layer prior to depositing the hard bias layers. Thus, the PMR transducer 200 is shown as including an insulating layer 207 and the hard bias layer 208. The hard bias layer 208 may substantially covers the magnetoresistive device 200.

Figure 7:
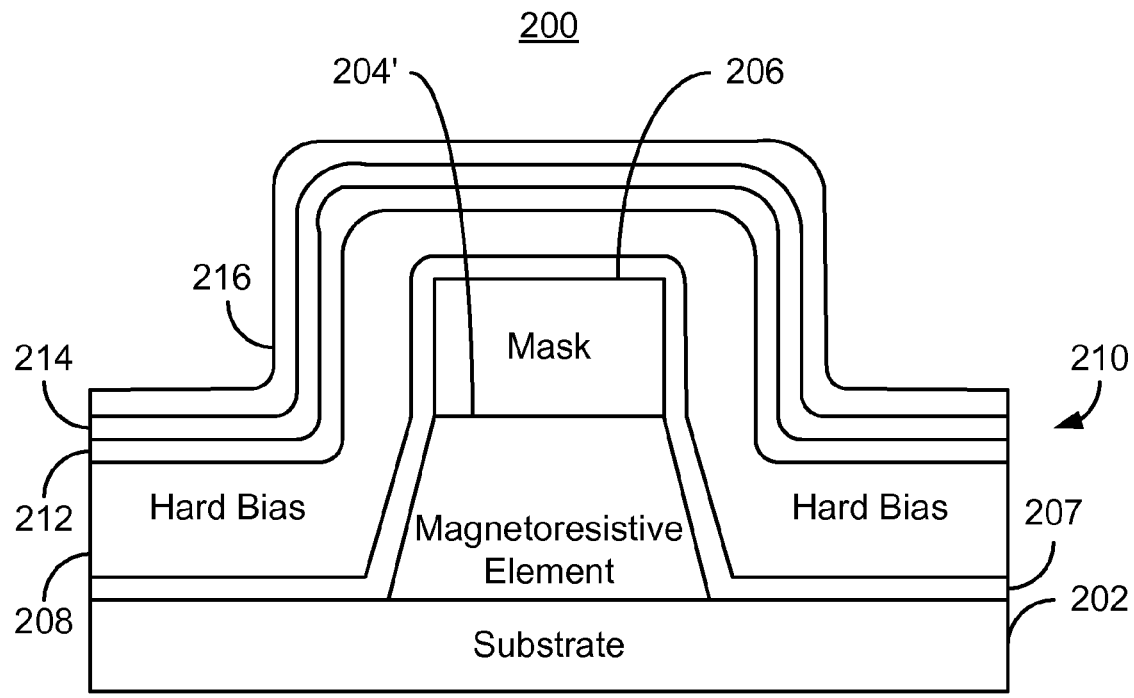

A hard bias capping structure is provided on the hard bias layer(s), via step 158. In one embodiment, the hard bias capping structure includes a first protective layer, a planarization stop layer, and a second protective layer. These layer are analogous to these described above. FIG. 7 depicts the magnetoresistive element 200 after step 158 is completed. Thus, the first protective layer 212, the planarization stop layer 214, and second protective layer 216 are all shown. The first protective layer 212 resides between the planarization stop layer 214 and the hard bias layer(s) 208. The first protective layer 212 includes materials such as at least one of Ru, Ta, Cr, and NiCr. In one embodiment, the first protective layer 212 is used to protect the hard bias layer 208 and to provide some material for consumption during subsequent ion milling. In one embodiment, the first protective layer 212 has a thickness of at least twenty and not more than one hundred and five Angstroms. In another embodiment, the first protective layer thickness is at least forty and not more eighty Angstroms.

The planarization stop layer 214 is used as a stop layer for a planarization, discussed below. In one embodiment, the planarization stop layer 214 is a CMP stop layer. The planarization stop layer 214 may include materials such as at least one of Ru and Rh. In one embodiment, the planarization stop layer 214 has a thickness of at least ten and not more than one hundred twenty Angstroms. In another embodiment, the thickness of the planarization stop layer 214 is at least thirty and not more than seventy Angstroms.

The planarization stop layer 214 resides between the first protective layer 212 and the second protective layer 216. The second protective layer 216 includes at least one of Ta, Ru, Cr and NiCr. The second protective layer 216 may be at least partially consumed during ion milling in subsequent processing. In one embodiment, the second protective layer 216 has a thickness of at least forty and not more than one hundred and five Angstroms. In another embodiment, the second protective layer thickness is at least fifty and not more than eighty-five Angstroms.

Figure 8:
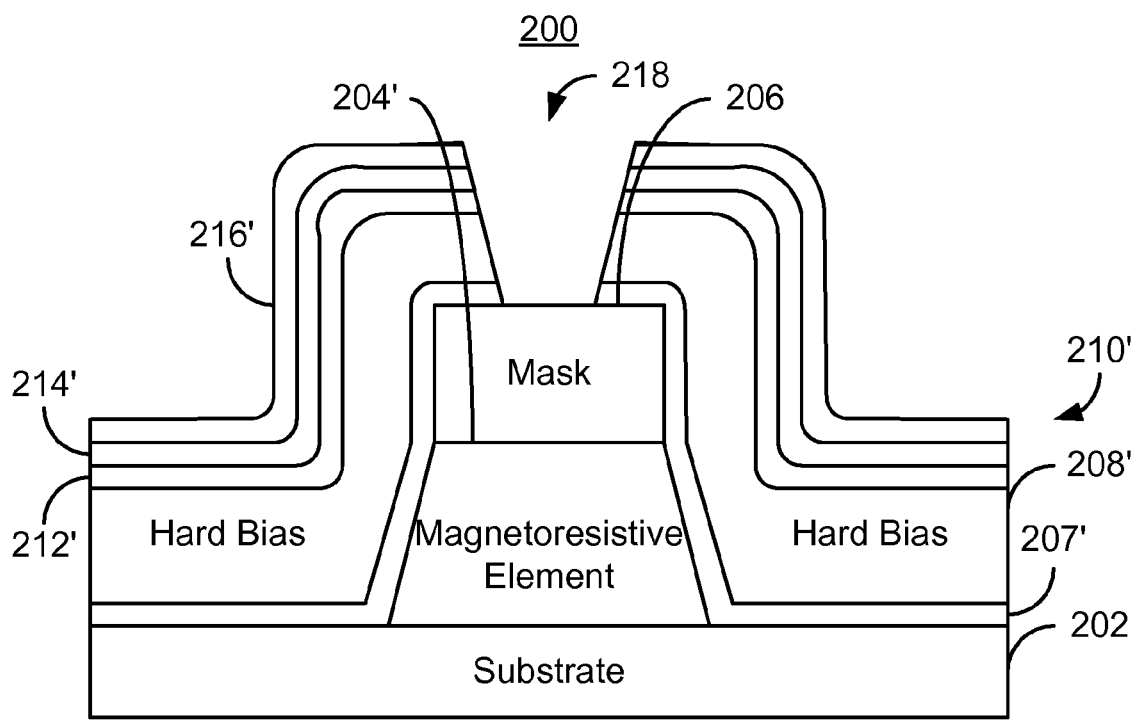

An aperture is provided in the hard bias layer(s) 208 in order to assist in lift-off of the mask 206, via step 160. In one embodiment, step 160 includes removing a portion of the hard bias layer(s) 206 as well as removing a portion of the capping structure 210. In one embodiment, this is accomplished through an ion mill. FIG. 8 depicts the magnetoresistive device 200 after step 160 is performed. Thus, an aperture 218 has been formed in the hard bias layer(s) 208' as well as in the layers 212', 214', and 216' of the hard bias capping structure 210. The aperture 218 is shown as above the magnetoresistive element 204'. In another embodiment, the aperture may simply be in proximity to the magnetoresistive element 204', rather than directly above the magnetoresistive element 204'. For simplicity, therefore, the aperture 218 is shown as small and above the magnetoresistive element 204'. However, the aperture 218 may be larger and/or located at a different position. During ion milling, at least a portion of the second protective layer 216' is consumed. Thus, another portion of the hard bias capping structure may be exposed in step 160.

The mask 206 is lifted off, via step 162. In addition, a planarization is performed in step 164. The planarization may remove any remaining portion of the mask 206 and other residues. The planarization performed in step 164 may be a CMP. In one embodiment, the opening of the aperture 218 in step 160 and the planarization in step 164 may be considered part of a planarization enhanced lift-off process. The planarization stop layer 214' is configured to stop or slow the planarization performed in step 164. Thus, the planarization stop layer 214' is configured for the planarization of step 164.

Figure 9:
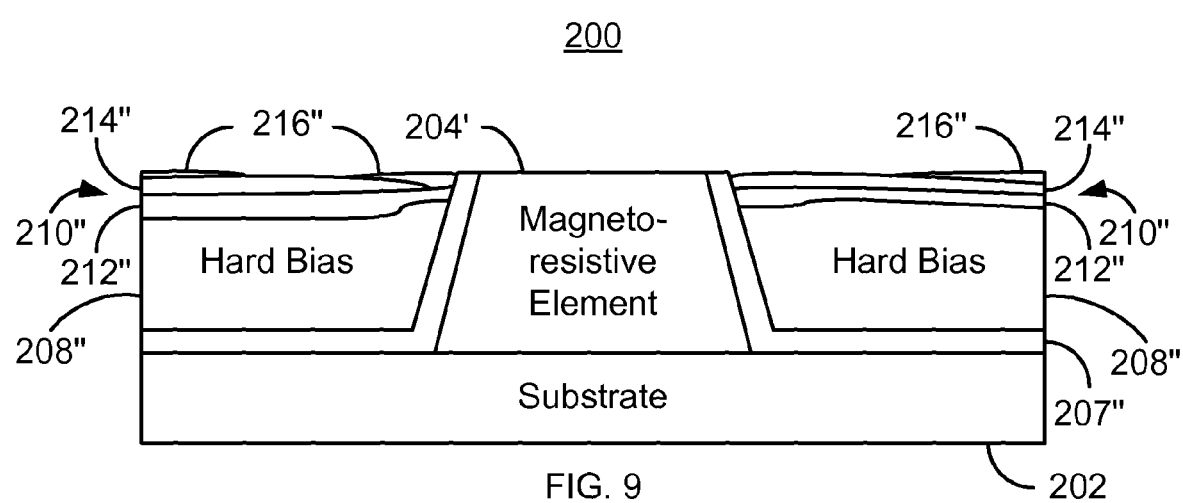

FIG. 9 depicts the magnetoresistive device 200 after step 164 has been completed. Thus, the mask 206 has been removed and the device 200 undergone planarization. Portions of the hard bias capping structure 210" have been removed. Thus, only portions 216" of the second protective layer 216 remain. In one embodiment, the portions 216" remaining include residues of the second protective layer. Although portions 216" are shown both near and distal from the magnetoresistive element 204', the portions may be located elsewhere. In addition, one or more of the portions 216" may not be present at all. Therefore, the portions 216" near and/or far from the magnetoresistive element 204' might be present. At least a portion of the planarization stop layer 214' has also been removed during the planarization. Consequently, only remaining portions 214" are shown in FIG. 9. The remaining portions of the planarization stop layer 214" may completely cover the first planarization stop layer 212" as shown on the right side of FIG. 9. Alternatively, portions of the first planarization stop layer 212" may be exposed, as is shown on the left side of FIG. 9.

Fabrication of the device 200 may be completed, via step 166. After fabrication has been completed, the remaining portions 216" of the second protective layer are generally completely removed. In addition, the first protective layer 212" may not completely cover the hard bias layers 208". Instead, some portion of the hard bias layers 208", particularly close to the magnetoresistive element 204', may be exposed to a subsequent layer. However, in another embodiment, the first protective layer 212" may completely cover the hard bias layers 208".

Using the method 150, a magnetic element having a low critical dimension may be provided. For example, the magnetoresistive element may have a critical dimension of ninety nanometers or less, particularly if a single layer mask may be employed. In addition, due to the configuration of the hard bias capping structure 210/210', subsequent processing may not adversely affect the materials in the hard bias layer(s) 208". In particular, ion milling and planarization during lift-off may not expose the hard bias layer(s) 208". As a result, failure of the devices may be reduced or minimized. Fabrication of the magnetoresistive device 200 may thus be improved.

We claim:

1. A method for providing at least one magnetoresistive device, the magnetoresistive device being formed from a plurality of magnetoresistive element layers, the method comprising:

providing a mask, the mask covering a first portion of the plurality of magnetoresistive element layers in at least one device area;

defining at least one magnetoresistive element from the plurality of magnetoresistive element layers using the mask;

depositing at least one hard bias layer;

providing a hard bias capping structure on the at least one hard bias layer, the hard bias capping structure including a first protective layer, a second protective layer, and a planarization stop layer, the first protective layer residing between the planarization stop layer and the at least one hard bias layer, the planarization stop layer residing between the first protective layer and the second protective layer; and performing a planarization, the planarization stop layer being configured for the planarization.

2. The method of claim 1 wherein the first protective layer includes at least one of Ru, Ta, Cr, and NiCr.

3. The method of claim 2 wherein the first protective layer has a thickness of at least twenty and not more than one hundred and five Angstroms.

4. The method of claim 3 wherein the thickness is at least forty and not more eighty Angstroms.

5. The method of claim 1 wherein the planarization stop layer further includes at least one of Ru and Rh.

6. The method of claim 5 wherein the planarization stop layer has a thickness of at least ten and not more than one hundred twenty Angstroms.

7. The method of claim 6 wherein the thickness is at least thirty and not more than seventy Angstroms.

8. The method of claim 1 wherein the second protective layer further includes at least one of Ta, Ru, Cr and NiCr.

9. The method of claim 8 wherein the second protective layer has a thickness of at least forty and not more than one hundred and five Angstroms.

10. The method of claim 9 wherein the thickness is at least fifty and not more than eighty-five Angstroms.

11. The method of claim 1 wherein the at least one magnetoresistive element has a track width of not more than ninety nanometers.

12. The method of claim 1 wherein the mask includes at least one side substantially free of undercuts.

13. A method for providing at least one magnetoresistive device, the magnetoresistive device being formed from a plurality of magnetoresistive element layers, the method comprising:

providing a mask, the mask covering a first portion of the plurality of magnetoresistive element layers in at least one device area;

defining at least one magnetoresistive element from the plurality of magnetoresistive element layers using the mask;

depositing at least one hard bias layer;

providing a hard bias capping structure on the at least one hard bias layer, the hard bias capping structure including a first protective layer, a second protective layer, and a planarization stop layer, the first protective layer residing between the planarization stop layer and the at least one hard bias layer, the planarization stop layer residing between the first protective layer and the second protective layer; and performing a lift-off of the mask after the hard bias capping structure has been provided; and performing a planarization, the planarization stop layer being configured for the planarization.

14. The method of claim 13 wherein the step of performing the lift-off further includes:

removing a portion of the at least one hard bias layer to open an aperture in the at least one hard bias layer, at least a portion of the hard bias capping structure being exposed in the step of removing the portion of the at least one hard bias layer.

15. A method for providing at least one magnetoresistive device, the magnetoresistive device being formed from a plurality of magnetoresistive element layers, the method comprising:

providing a photoresist mask, the photoresist mask covering a first portion of the plurality of magnetoresistive element layers in at least one device area;

defining at least one magnetoresistive element from the plurality of magnetoresistive element layers using the photoresist mask;

depositing at least one hard bias layer;

providing a hard bias capping structure including a first protective layer, a planarization stop layer, and a second protective layer, the planarization stop layer residing between the first protective layer and the second protective layer, the first protective layer residing between the planarization stop layer and the at least one hard bias layer, the first protective layer including at least one of Ta, Ru, Cr, and NiCr, the planarization stop layer including at least one of Ru and Rh, the second protective layer including at least one of Ru, Ta, Cr, and NiCr;

removing a portion of the at least one hard bias layer to open an aperture in the at least one hard bias layer, at least a portion of the hard bias capping structure being exposed in the step of removing the portion of the at least one hard bias layer;

lifting off the photoresist mask; and performing a planarization, the planarization stop layer being configured for the planarization.

* * * * *